United States Patent [19]

Gotou

[11] Patent Number: 4,983,538

[45] Date of Patent: Jan. 8, 1991

[54] METHOD FOR FABRICATING A SILICON CARBIDE SUBSTRATE

[75] Inventor: Hiroshi Gotou, Niiza, Japan

[73] Assignee: Fujitsu Limited, Kawasaki, Japan

[21] Appl. No.: 271,878

[22] Filed: Nov. 16, 1988

[30] Foreign Application Priority Data

Nov. 20, 1987 [JP] Japan .................. 62-294617

[51] Int. Cl.⁵ .................. H01L 21/18; H01L 21/302
[52] U.S. Cl. .................. 437/100; 437/86; 437/974; 437/84; 148/DIG. 135; 148/DIG. 148
[58] Field of Search .................. 437/100, 86, 84, 974, 437/228; 148/DIG. 135, DIG. 148

[56] References Cited

U.S. PATENT DOCUMENTS

| | | | |
|---|---|---|---|
| 3,400,309 | 9/1968 | Doo | 437/100 |
| 3,508,980 | 4/1970 | Jackson, Jr. et al. | 437/100 |
| 3,571,919 | 3/1971 | Gleim et al. | 437/100 |
| 3,575,731 | 4/1971 | Hoshi et al. | 437/86 |
| 3,577,285 | 5/1971 | Rutz | 437/100 |
| 3,900,943 | 8/1975 | Sirtl et al. | 148/DIG. 135 |
| 3,936,329 | 2/1976 | Kendall et al. | 437/974 |
| 3,956,032 | 5/1976 | Powell et al. | 148/DIG. 148 |
| 3,965,567 | 6/1976 | Beerwerth et al. | 437/974 |
| 4,028,149 | 6/1977 | Deines et al. | 437/228 |
| 4,066,483 | 1/1978 | D'Altroy et al. | 437/974 |
| 4,131,659 | 12/1978 | Authier et al. | 437/86 |
| 4,139,401 | 2/1979 | McWilliams et al. | 437/249 |
| 4,177,094 | 12/1979 | Kroon | 437/974 |
| 4,543,266 | 9/1985 | Matsuo et al. | 437/974 |
| 4,582,561 | 4/1986 | Ioku et al. | 156/624 |
| 4,601,779 | 7/1986 | Abernathey et al. | 437/974 |
| 4,757,028 | 7/1988 | Kondoh et al. | 437/100 |
| 4,762,807 | 8/1988 | Yamazaki | 148/DIG. 148 |
| 4,808,554 | 2/1989 | Yamazaki | 437/101 |
| 4,847,215 | 7/1989 | Hanaki et al. | 148/DIG. 148 |
| 4,855,254 | 8/1989 | Eshita et al. | 148/DIG. 148 |
| 4,888,304 | 12/1989 | Nakagawa et al. | 437/974 |

FOREIGN PATENT DOCUMENTS

| | | | |
|---|---|---|---|
| 2027429 | 12/1969 | France. | |
| 0003075 | 1/1978 | Japan | 437/100 |
| 0146299 | 12/1978 | Japan | 437/100 |
| 0146300 | 12/1978 | Japan | 437/100 |
| 0043200 | 4/1979 | Japan | 148/DIG. 148 |
| 0104488 | 8/1979 | Japan | 148/DIG. 148 |
| 0144499 | 11/1980 | Japan | 148/DIG. 148 |
| 0144500 | 11/1980 | Japan | 148/DIG. 148 |
| 0149192 | 11/1980 | Japan | 437/86 |
| 0137617 | 10/1981 | Japan | 437/86 |
| 0025280 | 2/1983 | Japan | 437/100 |
| 0098533 | 6/1984 | Japan | 437/100 |
| 0150621 | 8/1985 | Japan | 148/DIG. 148 |
| 0065648 | 3/1988 | Japan | 148/DIG. 135 |
| 0152153 | 6/1988 | Japan | 437/86 |
| 0222447 | 9/1988 | Japan | 437/86 |

(List continued on next page.)

OTHER PUBLICATIONS

Healy, "Integrated Semiconductor Device", IBM Technical Disclosure Bulletin, vol. 8, No. 7, 12/1965, pp. 1016–1017.

(List continued on next page.)

Primary Examiner—Olik Chaudhuri
Assistant Examiner—M. Wilczewski
Attorney, Agent, or Firm—Staas & Halsey

[57] ABSTRACT

Two methods for fabricating semiconductor substrate having a SOI structure by β-SiC, that is β-SiC on insulator structure, are disclosed. In the first method, two substrates are prepared, the first substrate is silicon coated by SiO₂, the second substrate is silicon on which β-SiC is hereto-epitaxially grown. These substrates are bonded to each other by heating. During the heating process, anodic bonding may be applied. Then, the bonded substrate is etched or mechanically polished off from the side of the second substrate, to expose the β-SiC layer. In the second method, β-SiC is grown on a silicon substrate. The surface of the substrate is coated with SiO₂, and then, polysilicon or poly-SiC is deposited on the surface of the β-SiC side. The substrate is then etched or mechanically polished from the side of the silicon substrate to expose the β-SiC.

26 Claims, 4 Drawing Sheets

FOREIGN PATENT DOCUMENTS

| | | | |
|---|---|---|---|
| 0226042 | 9/1988 | Japan | 437/86 |
| 0199457 | 8/1989 | Japan | 148/DIG. 135 |
| 0215041 | 8/1989 | Japan | 148/DIG. 135 |
| 1288278 | 9/1972 | United Kingdom . | |
| 2206445A | 1/1989 | United Kingdom . | |

OTHER PUBLICATIONS

Cuomo et al., "Growing Large Area Silicon Carbide and Aluminum Nitride Crystals", IBM Technical Disclosure Bulletin, vol. 17, No. 9, 2/1975, pp. 2819–2820.

Phillips et al., "Integrated Semiconductor Structure Arrangement", IBM Technical Disclosure Bulletin, vol. 8, No. 7, 12/1965, p. 1013.

J. B. Lasky et al., "Silicon-on-Insulator (SOI) by Bonding and Etch-Back", International Electron Devices Meeting, Washington, Dec. 1–4, 1985, Technical Digest, pp. 684–687, U.S.

R. C. Frye et al.; "A Field-Assisted Bonding Process for Silicon Dielectric Isolation", Journal of the Electrochmecial Soc., vol. 133, No. 8, Aug. 1986, pp. 1673–1677; New York, U.S.

B. Molnar et al., "High Resistivity Polysilicon as a Supporting and Isolating Substrate for Thin, Cubic Beta-Silicon Carbide Films", Extended Abstracts Fall Meeting, vol. 87-2, Honolulu, Oct. 18–23, 1987, p. 997, Abstract No. 700; Electrochem. Soc., Princeton, U.S.

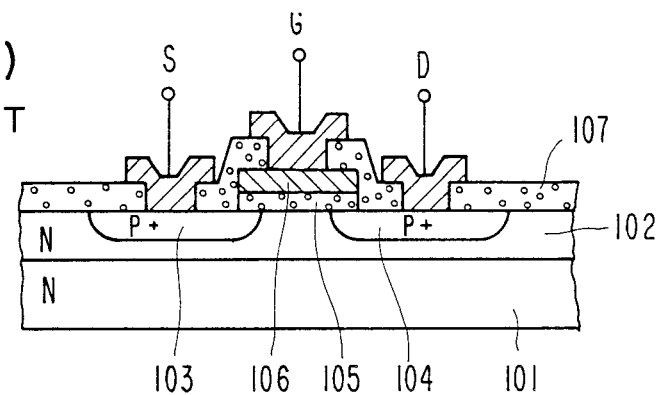
FIG. I(a) PRIOR ART
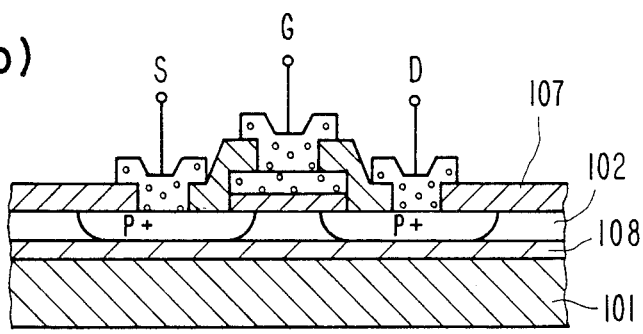
FIG. I(b)
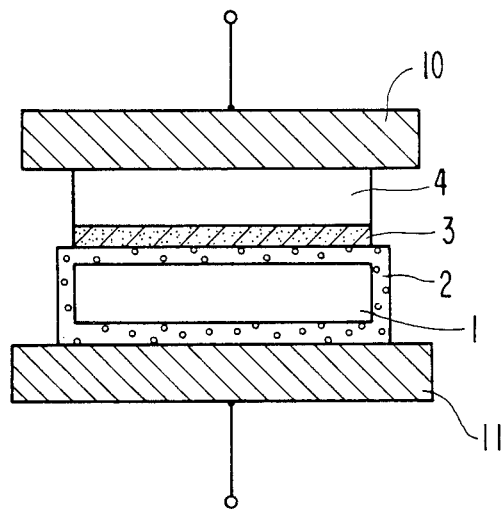
FIG. 3

FIG. 2(a)
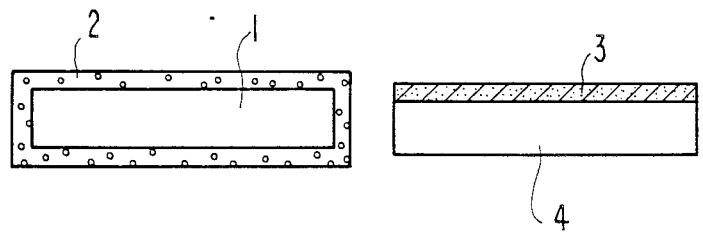
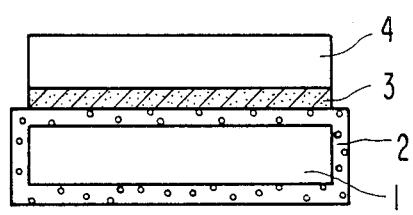
FIG. 2(b)
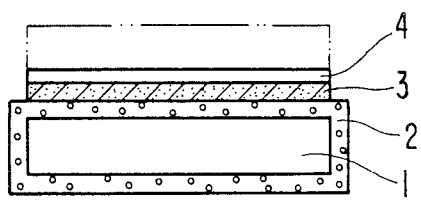
FIG. 2(c)
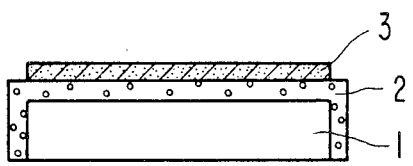
FIG. 2(d)

METHOD FOR FABRICATING A SILICON CARBIDE SUBSTRATE

BACKGROUND OF THE INVENTION

1. Field of the Invention

The present invention relates generally to a method for fabricating a silicon carbide substrate, and more specifically, to a method of forming a beta silicon carbide layer on silicon dioxide which is formed on a silicon substrate.

2. Description of the Related Art

Silicon carbide (SiC) is known as a semiconductor material which has a wide band gap in its energy level compared to that of silicon, and has a capability for fabricating semiconductor devices which can be used in high temperature environments. Especially, beta silicon carbide ($\beta$-SiC) is known to be desirable for fabricating various active devices, such as transistors or field effect transistors (FETs). More detail of those devices fabricated in SiC can be seen in, for example, "Experimental 3C-SiC MOSFET" by Y. Kondo et al. IEEE ED Letters Vol. EDL-7. No. 7, July 1986.

Single crystals of $\beta$-SiC usable for fabricating active devices such as transistors or FETs are still not available by the present state-of-the-art semiconductor technology. Therefore, these devices are fabricated using an epitaxially grown silicon carbide layer. It is considered that a better epitaxial layer of SiC may be obtained using a SiC substrate, but since SiC substrate which is large enough for fabricating various devices is not available, the growth of SiC layer is usually done using a silicon substrate. At the present time, therefore, a silicon substrate is considered to be the only practical semiconductor substrate on which $\beta$-SiC can be epitaxially grown. Such crystal growth is called hetero-epitaxial growth, because the crystal of the substrate and the grown crystal are different from each other.

An exemplary structure of a FET formed in a SiC epitaxial layer is shown in FIG. 1(a). In the figure, 101 designates a silicon substrate, and 102 is a hetero-epitaxially grown $\beta$-SiC layer. In this example, both the silicon substrate and the SiC layer have n type conductivity. A source region 103, and drain region 104 are fabricated by doping p type impurities. Over the channel region is formed a gate oxide layer 105 which is composed of a silicon dioxide ($SiO_2$), and over which a gate electrode 106 is formed. A surface of the device is coated with a silicon dioxide layer 107. The electrodes indicated by G, S and D are respectively the gate, source and drain electrodes which are connected to respective regions through contact holes formed in the $SiO_2$ layer 107.

In the above structure of a FET, it was found that leakage current is relatively large. This is mainly due to the fact that the SiC epitaxial layer 102 formed on the silicon substrate 101 is poor in quality. Therefore, the pn junction formed in such SiC layer is apt to become a leaky junction Moreover, the conductivity of the silicon substrate 101 becomes higher than that of the SiC layer 102 at high temperatures (500–600° C. for example), in which the SiC devices are expected to operate. Therefore, FETs such as the one shown in FIG. 1(a) are difficult to be actually used in high temperature environments. Such defects occur on other types of devices made from SiC material.

To eliminate these defects of SiC devices, it has been proposed to insert an additional layer between the SiC layer and the Si substrate in order to suppress the leakage current through the silicon substrate. For example, in "Fabrication of Inversion-Type n-Channel MOSFET's Using Cubic-SiC on Si(100)" by K. Shibahara et al., IEEE ELECTRON DEVICE LETTERS, Vol. EDL-7, No. 12, December 1986, or "Insulated-Gate and Junction-Gate FET's of CVD-Grown $\beta$-SiC" by K. Furukawa et al. IEEE ED Letters, Vol. EDL-8, No. 2, Feb. 1987, it has been proposed to insert another conductivity type SiC layer and to form a pn junction between the former SiC layer. This pn junction prevents the leakage current.

A known type of silicon device is a SOI (silicon on insulator) structure, in which a silicon crystal is grown on an insulator such as silicon dioxide layer formed on silicon substrate. If it is possible to grow a $\beta$-SiC crystal on an insulator, it must be effective for preventing the leakage current through the substrate.

A fundamental configuration of a SOI is shown in FIG. 1(b). The same reference numerals designate the same parts as in FIGS. 1(a) and 1(b). Compared to FIG. 1(a), the proposed new device of FIG. 1(b) includes a silicon dioxide layer 108 between the silicon substrate 101 and the SiC layer 102. By this silicon dioxide layer 108, the leakage current of the SiC FET will be reduced to a great extent, because the leak current running through the silicon substrate 101 is suppressed.

A problem is now how to fabricate such a device, that is, an SOI type device formed by SiC. For silicon devices, the SOI structure that means "semiconductor on insulator" has already been realized (SOI sometimes means silicon on insulator structure). With regard to SiC devices, however, a method to provide the SOI (SiC on insulator) structure has not heretofore been established. For making such devices, a substrate having a structure of SiC on insulator is required. One proposal is using a $\alpha$-SiC crystal as the insulating substrate. The resistivity of undoped $\alpha$-SiC is very high, but a large size perfect crystal of $\alpha$-siC is still not available. The size of the substrate is another important factor for fabricating various semiconductor devices.

SUMMARY OF THE INVENTION

An object of the present invention, therefore, is to provide a method for fabricating a semiconductor substrate having a structure of $\beta$-SiC epitaxial layer grown on an insulator, that is, an SOI (SiC on insulator) structure.

Another object of the present invention is to provide a large size $\beta$-SiC substrate, on which various kinds of semiconductor devices can be fabricated.

Still another object of the present invention is to reduce leakage current of devices fabricated with a silicon carbide layer.

The present invention utilizes a $SiO_2$ layer as an insulation layer between the SiC and the substrates, and discloses two methods for fabricating the SiC-$SiO_2$-Si structure. The first method realizes the aforementioned structure by bonding two substrates. The second method realizes the same structure by hetero-epitaxial growth and etching or polishing.

In the first method, two kinds of substrates are prepared. The first substrate is a silicon substrate, for example, which later will become a base substrate for supporting the silicon carbide layer. The second substrate is composed of a silicon single crystal. The surface of the first substrate is coated with a silicon dioxide layer for example. On the surface of the second substrate is heteroimportant epitaxially grown a silicon carbide layer in which the semiconductor devices are fabricated. These two substrates are stacked on top of each other and thermally treated to bond them together. Then, the bonded substrate is polished or etched off from the back side of the second substrate, so as to remove the silicon layer of the second substrate and expose the silicon carbide layer formed on the second substrate. The exposed silicon carbide layer of the second substrate is left bonded on the silicon dioxide layer supported by the first substrate. Thus, the SiC on $SiO_2$, that is, the SOI structure, is realized.

In the second method, a SiC layer is heteroepitaxially grown on a second silicon substrate. The substrate is then coated with a $SiO_2$ layer. Over the $SiO_2$ layer, a polysilicon is deposited by chemical vapor deposition (CVD) to form a first substrate. Then, the substrate is etched from the second silicon substrate side to remove the silicon substrate and to expose the SiC layer.

Various modifications of the above fundamental processes are possible. For example, in the first method, the surface of the second substrate may be coated with $SiO_2$ after the SiC layer is grown thereon. On the contrary, the first substrate may not be coated by $SiO_2$ until it is stacked on the second substrate. The first substrate may be of any other semiconductor material, such as polycrystalline silicon (polysilicon) or $\alpha$-SiC. The surface of the second substrate may be further coated with phosphosilicate glass (PSG), for example. During the thermal treatment process for bonding the substrates, an electrostatic potential can be applied between the first and second substrate to avoid voids and increase the adhesion strength.

These and other modifications and advantages of the present invention will become apparent in the following detailed description of preferred embodiments and accompanying drawings.

BRIEF DESCRIPTION OF THE DRAWINGS

FIG. 1(a) is a schematic cross-sectional view of a known FET formed in a silicon carbide substrate;

FIG. 1(b) is a schematic cross-sectional view of an FET which eliminates leakage current associated with the FET of FIG. 1(a);

FIGS. 2(a)-2(d) are schematic cross-sectional views of a substrate illustrating the fundamental process of the present invention for fabricating a SiC on insulator on a semiconductor structure, wherein FIG. 2(a) shows a combination of first and second substrates prepared for the process;

FIG. 2(b) shows a state in which the two substrates are stacked to each other;

FIG. 2(c) illustrates polishing or etching the second substrate from its back side; and FIG. 2(d) illustrates the final state of the substrate which has a SiC on $SiO_2$ on semiconductor structure;

FIG. 3 illustrates the application of electrostatic potential to the stacked substrates;

DETAILED DESCRIPTION OF THE PREFERRED EMBODIMENTS

Figure 4A:
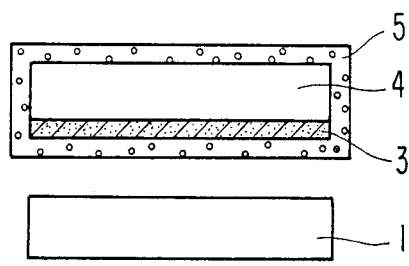
FIGS. 4(a)-4(c) illustrate variations of the combination of the first and second substrates applicable for the process illustrated in FIG. 2.

It is known that silicon carbide has two types of crystal structure, $\alpha$ and $\beta$-type crystals. The $\beta$-type crystal is much more desirable for fabricating active devices such as transistors or FET's. In the description hereafter, if it is not specially identified, the words "silicon carbide", or "SiC" means only the $\beta$-type silicon carbide ($\beta$-SiC).

The present invention discloses two methods to realize an SOI structure of SiC, that is, SiC on insulator structure. The first method utilizes a technique of bonding the substrate, while the second method utilizes hetero-epitaxial growth and etching technology. The first method will be described as one preferred embodiment.

It is known in the art that silicon substrates can be bonded to each other by insertion of a silicon dioxide layer between the two substrates and treating them at high temperatures. Further details of such technology are disclosed in, for example, "SILICON-ON-INSULATOR (SOI) BY BONDING AND ETCH-BACK" by J. B. Lasky et al. IEDM 85, 1985 IEEE, or "Study of Si-Wafer Directly Bonded Interface Effect on Power Device Characteristics" by H. Ohashi et al. IEDM 87, 1987 IEEE. However, bonding technology applicable for SiC substrates has heretofore been unknown. The present inventor discovered that a SiC layer can be bonded on $SiO_2$ layer by proper thermal treatment. By applying this discovery, it became possible to provide a substrate having a SiC-I-Si structure.

FIGS. 2(a)-2(d) illustrate the process steps undertaken for fabricating a $SiC$-$SiO_2$-Si substrate, that is, SiC on $SiO_2$ layer formed on Si substrate by bonding two kinds of substrates. These figures schematically illustrate how the cross-sections of the substrates vary at each step of the fabrication process.

First, as shown in FIG. 2(a), two kinds of substrates 1 and 4 are prepared. The first substrate 1 is an n type silicon substrate of about 600 $\mu$m thick, for example. The surface of the first substrate 1 is covered by a $SiO_2$ layer 2 of 0.5-1 $\mu$m thick. This $SiO_2$ layer is formed by chemical vapor deposition (CVD) or thermal oxidation. The second substrate 4 is an n type silicon single crystal of about 600 $\mu$m thick, for example. On one side of the second substrate 4 is grown an n type SiC crystal 3 of about 0.5 $\mu$m thick for example.

The growth technology of the SiC layer 3 is known in the art as a hetero-epitaxial growth, which will be described briefly. The surface of the second substrate 4 is carbonized by heating the substrate at about 1,300° C. in a flow of propane gas ($C_3H_8$). Then, the gas is switched to a mixture of propane and silane gas ($SiH_4$), and the temperature is raised to 1100–1200° C. By this process, a SiC single crystal is epitaxially grown on the surface of the substrate 4. Further detail can be seen in, for example, "Fabrication of Inversion-Type n-Channel MOSFET's Using Cubic-SiC on Si(100)" by K. Shibahara et al. IEEE ELECTRON DEVICE LETTERS, Vol. EDL-7, No. 2, December 1986.

The first and second substrates are stacked on each other as shown in FIG. 2(b), and thermally treated at 600° C. for 10 min. in an inert gas ambient, such as nitrogen, at a pressure of about 0.1 Pa. This process step is referred to as the first thermal treatment. Then, the temperature is increased to 1100° C. and annealing takes place for about 30 min. This process step is referred to as the second thermal treatment. By these thermal treatments, the two substrates 1 and 4 are bonded to each other.

During thermal treatment, it is desirable to place a weight on the stacked substrates to remedy a slightly remained curvature in the substrates, and to prevent voids from appearing in the bonding surface. For this purpose, the weight may be a carbon graphite plate of about 1 cm thick.

To avoid the voids, it is also effective to apply a technique called anodic bonding. Details of the technique can be seen in "A Field-Assisted Bonding Process for Silicon Dielectric Isolation" by R. C. Frye et al., Jour. Electrochem. Soc. Vol. 133, No. 8, August 1986. This literature discloses a technology for bonding a silicon substrate on silicon. The inventor herein applied the above anodic bonding method for bonding SiC on $SiO_2$ coated silicon, and found that it is effective to achieve a void free bonding.

Electrical potential is applied between the first and second substrates during the first thermal treatment. Adhesion of the substrates does not depend on the polarity of the electric field. This is due to the fact that the SiC layer 3 and the Si substrate 4 compose a capacitor separated by the $SiO_2$ layer 2, and the electrostatic force which attracts the SiC layer 3 toward the second substrate 1 becomes very strong, because the thickness of the insulation layer is very thin (about 1 $\mu$m). Thus, an applied electrical potential eliminates the need for using the weight.

FIG. 3 shows how the electric voltage is applied between the first substrate 1 and the second substrate 4. The upper electrode 10 and the lower electrode 11 are carbon graphite plates about 1 cm thick. The voltage applied between the electrodes is as high as possible, so long as electric breakdown does not occur, because the attractive force between the substrates becomes larger. In one embodiment, a static voltage of 200 V is applied between the upper and lower electrodes 10 and 11. The carbon graphite electrode placed on the substrate also functions as a weight to eliminate a curvature of the substrates and avoid the appearance of voids at the bonded surface.

In a preferred embodiment, the voltage is applied as a pulse voltage rather than the static voltage. This is generally known in the bonding art for silicon substrates. Details can be seen, for example, in "SOI Substrate by Bonding Technology" (written in Japanese) by Arimoto et al., Publication 30a-B-1 from 1987 Spring Convention of Japan Society of Applied Physics, March 1987. In an embodiment of the present invention, pulse voltage of 500 V, 100 ms duration was applied with a repetition period of 500 ms during the first thermal treatment. By applying such technique, a void free substrate of large size, four inches in diameter for example, was obtained.

Turning back to FIG. 2(c), after the bonding is completed, the silicon layer 4 of the first substrate is removed by mechanical polishing or chemical etching from the back side of the second substrate 4 to expose the SiC layer 3 as shown in FIG. 2(d). In this removing process, it is important to take care not to remove the SiC layer 3. The removing process of the Si layer 4 is not as critical, because $\beta$-SiC is harder compared to Si, and SiC is not etched by the etchant used for etching Si (mixture of hydrofluolic acid and nitric acid, for example). Therefore, over polishing or over etching can be easily avoided. In such a manner, a large size substrate having a SiC—$SiO_2$—Si structured substrate is obtained. A large sized substrate is necessary for fabricating semiconductor devices at low cost.

The above fundamental processes of the present invention can be modified in various ways, some of which will be described below.

Figure 4B:
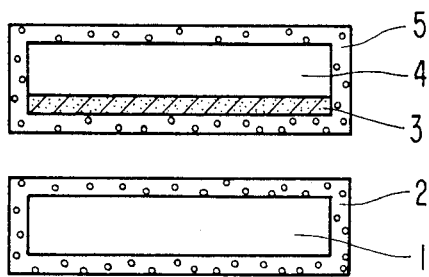
Figure 4C:
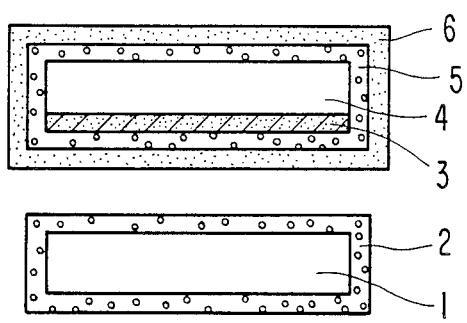

FIGS. 4(a)–4(c) show some modifications in the preparation stage of the first and second substrates of FIG. 2(a). Each of FIGS. 4(a)–4(c) corresponds respectively to the stage (a) of FIG. 2, in which the first and second substrates are prepared before they are bonded to each other. In FIGS. 4(a)–4(c), the second substrate 4 and the SiC layer 3 are shown upside down ready to be piled on the first substrate 1. In a first modification of FIG. 4(a), compared to FIG. 2(a), the first substrate 1 is not coated by $SiO_2$, but the second substrate 4 and the SiC layer 3 are coated with a $SiO_2$ layer 5 which is formed by CVD. The thickness of the $SiO_2$ layer 5 is 0.5 to 1.0 $\mu$m. The following steps to bond these substrates are similar to those of FIG. 2 and 3.

In a second modification shown in FIG. 4(b), both the first substrate 1, and the second substrate 4, which has the SiC layer 3, are coated with $SiO_2$ layers 2 and 5, respectively. The thickness of both these $SiO_2$ layers is about 0.2 $\mu$m. In a third modification shown in FIG. 4(c), the first substrate 1 is coated with a $SiO_2$ layer of about 0.5 $\mu$m thick. The second substrate 4 and the SiC layer 3 are coated with $SiO_2$ layer 5 of about 0.5 $\mu$m thick, and further coated by a phosphosilicate glass (PSG) layer 6. The thickness of the PSG layer 6 is about 1 $\mu$m and formed by CVD. The fabrication technology of the $SiO_2$ layer 5 and the PSG layer 6 are all conventional ones in the art, and therefore, further description is omitted. The bonding method is similar to that described with respect to FIG. 2.

Further modification of the fundamental process illustrated in FIGS. 2(a)–2(d) is possible. For instance, the material of the first substrate 1 can be changed from silicon to $\alpha$-SiC. As mentioned before, undoped $\alpha$-SiC has a high resistivity. $\alpha$-SiC crystal still includes imperfections, but a fairly large crystal is available. Thus, a sliced $\alpha$-SiC crystal can be used as a first substrate 1 of the fundamental process of FIG. 2. Other processes similar to those of FIG. 2 will be apparent to one of ordinary skill in the art. For example, $\alpha$-SiC can be used for the first substrate 1 in any of the modified processes shown in FIG. 3 as a substitution of the material of the first substrate 1. By doing so, a SiC-$SiO_2$-SiC structure is realized. Such structure is better than Si substrate, because it can withstand higher thermal treatments.

Figure 5A:
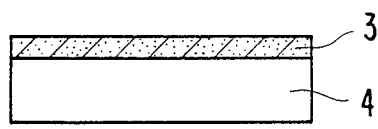
FIGS. 5(a)-5(d) are schematic cross-sections of a substrate illustrating steps of a modified process of the fundamental process illustrated in FIGS. 2, using polysilicon.
Figure 5B:
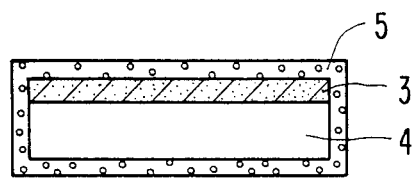
Figure 5C:
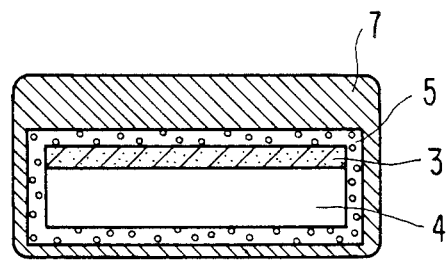
Figure 5D:
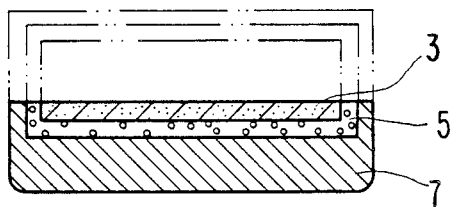

Next, the second method of the invention will be described. The process steps of the second method are schematically illustrated in FIGS. 5(a)–5(d). A second substrate 4 is made of n type silicon single crystal of about 600 $\mu$m thick, for example. As shown in FIG. 5(a), an n type SiC crystal layer 3 about 0.5 $\mu$m thick (for example) is grown over a second substrate 4 by a hetero-epitaxial growth process. These steps are similar to the ones which were described with respect to FIG. 2(a). The substrate is thermally oxidized at about 1,000° C. to form an $SiO_2$ layer about 0.2 $\mu$m thick over the SiC layer 3. By means of this thermal oxidation step, the surface of the second silicon substrate 4 is also oxidized as shown in FIG. 5(b). Then, a polysilicon layer 7 about 500 $\mu$m thick is formed over the upper surface (the side of SiC layer 3) of the substrate by CVD. These CVD process steps are known in the art, wherein dichlorosilane ($SiH_2Cl_2$), for example, is used as a reaction gas. By this CVD process, the polysilicon is mainly deposited on the upper surface of the SiC layer 3, but the entire surface of the substrate is coated with polysilicon as shown in FIG. 5(c). Then the substrate is etched or mechanically polished from the back side of the second substrate 4 to expose the SiC layer 3, as shown in FIG. 5(d). This is similar to the process steps described with respect to FIG. 2(c). In FIG. 5(d), the substrate is shown inverted compared to FIG. 5(c). In such a manner, a SiC-SiO$_2$-SiC is realized. In this case, the first substrate corresponding to 1 of FIG. 2 is replaced by polysilicon layer 7.

A variation of the above fundamental process of the second method is possible. The polysilicon layer 7 may be replaced by polycrystalline SiC (poly-SiC). For such variation, the poly-SiC is formed in the CVD process of FIG. 5(c). The fabricated SiC-SiO$_2$-SiC structure is capable of bearing higher thermal treatment compared to the Si substrate SiC. This is a desirable characteristic for fabricating devices in the SiC layer, because the SiC device fabrication process includes very high temperature processing.

As has been described above, by the methods disclosed in this specification, it is possible to realize an SOI structure using β-SiC. Variations of the above embodiments are possible. For example, the etching of the second substrate 4 may be replaced by reactive ion etching (RIE). In the above disclosure, the dimensions, the conductivity type of the substrate, are all described referring to a preferred embodiment. They are variable dependent on the devices finally fabricated on the substrate. The scope of the invention, therefore, is not restricted to the above described embodiments.

What is claimed is:

1. A method for fabricating a semiconductor substrate having a semiconductor on insulator structure, said semiconductor being beta type silicon carbide, said method comprising the steps of:
   (a) preparing a first substrate made of a first semiconductor material, and a second substrate made of silicon single crystal;
   (b) forming a layer of beta type silicon carbide single crystal on a surface of said second substrate;
   (c) coating a surface of said first substrate with an insulator layer;
   (d) stacking said second substrate on said first substrate juxtaposing said beta type silicon carbide layer to said first substrate;
   (e) bonding said first substrate and said second substrate together by heating in an inert gas ambient; and
   (f) removing said second substrate to expose said beta type silicon carbide layer.

2. A method for fabricating a semiconductor substrate as set forth in claim 1, wherein said coating step comprises coating a surface of said first substrate with a silicon dioxide layer.

3. A method for fabricating a semiconductor substrate as set forth in claim 1, wherein said inert gas is nitrogen.

4. A method for fabricating a semiconductor substrate as set forth in claim 1, wherein said bonding step further comprises applying electric potential between said first and second substrates.

5. A method for fabricating a semiconductor substrate as set forth in claim 1, wherein said first semiconductor material is silicon.

6. A method for fabricating a semiconductor substrate as set forth in claim 1, wherein said first semiconductor material is silicon carbide.

7. A method for fabricating a semiconductor substrate having a semiconductor on insulator structure, said semiconductor being beta type silicon carbide, said method comprising the steps of:
   (a) preparing a first substrate made of a first semiconductor material, and a second substrate made of silicon single crystal;
   b) forming a layer of beta type silicon carbide single crystal on a surface of said second substrate;
   (c) coating a surface of said second substrate and beta type silicon carbide layer with an insulator layer;
   (d) stacking said second substrate on said first substrate juxtaposing said beta type silicon carbide layer to said first substrate;
   (e) bonding said first substrate and second substrate together by heating in an inert gas ambient; and
   (f) removing said second substrate to expose said beta type silicon carbide layer.

8. A method for fabricating a semiconductor substrate as set forth in claim 7, wherein said insulator layer is a silicon dioxide layer.

9. A method for fabricating a semiconductor substrate as set forth in claim 7, wherein said inert gas is nitrogen.

10. A method for fabricating a semiconductor substrate as set forth in claim 7, wherein said bonding step further comprises applying an electric potential between said first and second substrates.

11. A method for fabricating a semiconductor substrate as set forth in claim 7, wherein said first semiconductor material is silicon.

12. A method for fabricating a semiconductor substrate as set forth in claim 7, wherein said first semiconductor material is silicon carbide.

13. A method for fabricating a semiconductor substrate having a semiconductor on insulator structure, said semiconductor being beta type silicon carbide, said method comprising the steps of:
   (a) preparing a first substrate made of a first semiconductor material, and a second substrate made of silicon single crystal;
   (b) forming a layer of beta type silicon carbide single crystal on a surface of said second substrate;
   (c) coating said first substrate, second substrate and beta type silicon carbide layer with an insulator layer;
   (d) stacking said second substrate on said first substrate juxtaposing said beta type silicon carbide layer to said first substrate;
   (e) bonding said coated first and second substrates together by heating in an inert gas ambient; and
   (f) removing said second substrate to expose said beta type silicon carbide layer 14. A method for fabricating a semiconductor substrate as set forth in claim 13, wherein said insulator layer is made of silicon dioxide.

15. A method for fabricating a semiconductor substrate as set forth in claim 13, wherein said inert gas gas is nitrogen.

16. A method for fabricating semiconductor substrate as set forth in claim 13, wherein said bonding step further comprises applying electric potential between said first and second substrates.

17. A method for fabricating a semiconductor substrate as set forth in claim 13, wherein said first semiconductor material is silicon.

18. A method for fabricating a semiconductor substrate as set forth in claim 13, further comprising a step of further coating said second substrate and beta type silicon carbide layer with phospholsilicate glass, after coating said first substrate, second substrate and beta silicon carbide layer with an insulator layer, and before stacking.

19. A method for fabricating a semiconductor substrate as set forth in claim 18, wherein said insulator layer is made of silicon dioxide.

20. A method for fabricating a semiconductor substrate as set forth in claim 18, wherein said inert gas is nitrogen.

21. A method for fabricating semiconductor substrate as set forth in claim 18, wherein said bonding step further comprises applying electric potential between said first and second substrates.

22. A method for fabricating a semiconductor substrate as set forth in claim 14, wherein said first semiconductor material is silicon.

23. A method for fabricating a semiconductor substrate as set forth in claim 14, wherein said first semiconductor material is silicon carbide.

24. A method for fabricating a semiconductor substrate as set forth in claim 14, wherein said first semiconductor material is silicon carbide.

25. A method for fabricating a semiconductor substrate having a semiconductor on insulator structure, said semiconductor being beta type silicon carbide, said method comprising the steps of:
   (a) forming a layer of beta type silicon carbide crystal on a surface of a silicon single crystal;
   (b) coating the surface of said silicon substrate and beta type silicon carbide layer with an insulator layer;
   (c) depositing a material selected from the group consisting of polycrystalline silicon and polycrystalline silicon carbide on a beta type silicon carbide coated side of said silicon substrate; and
   (d) removing said silicon substrate to expose said beta type silicon carbide layer.

26. A method for fabricating a semiconductor substrate as set forth in claim 25, wherein said insulator layer is made of silicon dioxide.

* * * * *